United States Patent
Hori et al.

(10) Patent No.: US 8,841,918 B2
(45) Date of Patent: Sep. 23, 2014

(54) SWITCHING APPARATUS AND TEST APPARATUS

(75) Inventors: Hisao Hori, Miyagi (JP); Yoshikazu Abe, Miyagi (JP); Yoshihiro Sato, Miyagi (JP)

(73) Assignee: Advantest Corporation, Tokyo (JP)

( * ) Notice: Subject to any disclaimer, the term of this patent is extended or adjusted under 35 U.S.C. 154(b) by 245 days.

(21) Appl. No.: 13/277,234

(22) Filed: Oct. 20, 2011

(65) Prior Publication Data

US 2013/0038335 A1 Feb. 14, 2013

(30) Foreign Application Priority Data

May 10, 2011 (JP) ................................. 2011-105610

(51) Int. Cl.
| | |
|---|---|
| *G01R 31/02* | (2006.01) |
| *G01R 31/26* | (2014.01) |
| *G01R 1/067* | (2006.01) |
| *H01H 57/00* | (2006.01) |
| *G01R 1/073* | (2006.01) |
| *H01L 41/09* | (2006.01) |

(52) U.S. Cl.
CPC ........ *G01R 1/06705* (2013.01); *G01R 1/07392* (2013.01); *H01H 2057/006* (2013.01); *H01L 41/094* (2013.01); *H01H 57/00* (2013.01)
USPC .................. 324/537; 324/750.02; 324/750.24; 310/330; 200/181

(58) Field of Classification Search
CPC ................ H01L 41/0475; H01L 41/08; G01R 31/2805–31/2851; G01R 31/02; G01R 31/26; G06F 11/2033; H01H 57/00
USPC ........................ 324/754.08–754.13, 537–538; 310/330–332; 200/181
See application file for complete search history.

(56) References Cited

U.S. PATENT DOCUMENTS

| | | | |
|---|---|---|---|
| 8,450,912 B2 * | 5/2013 | Fujii | 310/358 |
| 2004/0183402 A1 * | 9/2004 | Mizuyama et al. | 310/328 |

(Continued)

FOREIGN PATENT DOCUMENTS

| | | |
|---|---|---|
| JP | S62-141789 A | 6/1987 |
| JP | H04-192384 A | 7/1992 |
| JP | H09-191137 A | 7/1997 |
| JP | 2000-80540 A | 3/2000 |
| JP | 2005-237145 A | 9/2005 |

OTHER PUBLICATIONS

"Notice of Reasons for Rejection" issued by the Japan Patent Office on May 7, 2013 for application No. 2011-105610.

*Primary Examiner* — Melissa Koval
*Assistant Examiner* — Emily Chan (57) ABSTRACT

Provided is a switching apparatus comprising a contact point section that includes a first contact point; an actuator that includes a second contact point and moves the second contact point to contact or move away from the first contact point; and a control section that controls a first drive voltage. The actuator includes a first piezoelectric film that expands and contracts according to the first drive voltage and a support layer disposed on the first piezoelectric film. The control section causes the first piezoelectric film to contract by causing a change from a voltage that applies an electric field that is less than a first coercive electric field to a voltage that applies an electric field that exceeds the first coercive electric field, and causes the first piezoelectric film to expand by outputting a voltage that applies an electric field that is less than a second coercive electric field.

20 Claims, 5 Drawing Sheets

(56) References Cited

U.S. PATENT DOCUMENTS

| | | | |
|---|---|---|---|
| 2005/0140249 A1* | 6/2005 | Kita et al. | 310/359 |
| 2008/0142348 A1* | 6/2008 | Nguyen et al. | 200/275 |
| 2009/0085690 A1* | 4/2009 | Takeuchi et al. | 333/103 |
| 2012/0268102 A1* | 10/2012 | Hori et al. | 324/76.11 |

FOREIGN PATENT DOCUMENTS

| | | |
|---|---|---|
| JP | 2005-332802 A | 12/2005 |
| JP | 2006-523923 A | 10/2006 |
| JP | 2008-91167 A | 4/2008 |
| WO | 03/016930 A1 | 2/2003 |

* cited by examiner

SWITCHING APPARATUS AND TEST APPARATUS

BACKGROUND

1. Technical Field

The present invention relates to a switching apparatus and a test apparatus.

2. Related Art

A conventional circuit for driving an actuator including piezoelectric films bends the actuator by applying voltage to the piezoelectric films to expand and contract the piezoelectric films. Such a drive circuit controls the voltage applied to each piezoelectric film disposed respectively on the top surface and the bottom surface of the actuator, and uses bimorph operation in which one of the piezoelectric films is expanded and the other is contracted, as shown in Patent Document 1, for example.

Patent Document 1: Japanese Patent Application Publication No. 2000-80540

However, the expansion and contraction of each piezoelectric film is no greater than approximately 1% of the total length of the piezoelectric film, and therefore the displacement of the actuator is very small relative to the size of the actuator. Furthermore, if the expansion and contraction characteristic of each piezoelectric film is complicated with respect to the sign of the applied voltage, only a portion of the expansion and contraction characteristic of the piezoelectric film can be used, and the displacement amount of the actuator cannot be increased.

SUMMARY

Therefore, it is an object of an aspect of the innovations herein to provide a switching apparatus and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a switching apparatus comprising a contact point section that includes a first contact point; an actuator that includes a second contact point and moves the second contact point to contact or move away from the first contact point; and a control section that controls a first drive voltage. The actuator includes a first piezoelectric film that expands and contracts according to the first drive voltage and a support layer disposed on the first piezoelectric film, and the control section causes the first piezoelectric film to contract by causing a change from a voltage that applies an electric field to the first piezoelectric film that is less than a first coercive electric field to a voltage that applies an electric field to the first piezoelectric film that exceeds the first coercive electric field, and causes the first piezoelectric film to expand by outputting a voltage that applies an electric field to the first piezoelectric film that is less than a second coercive electric field.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
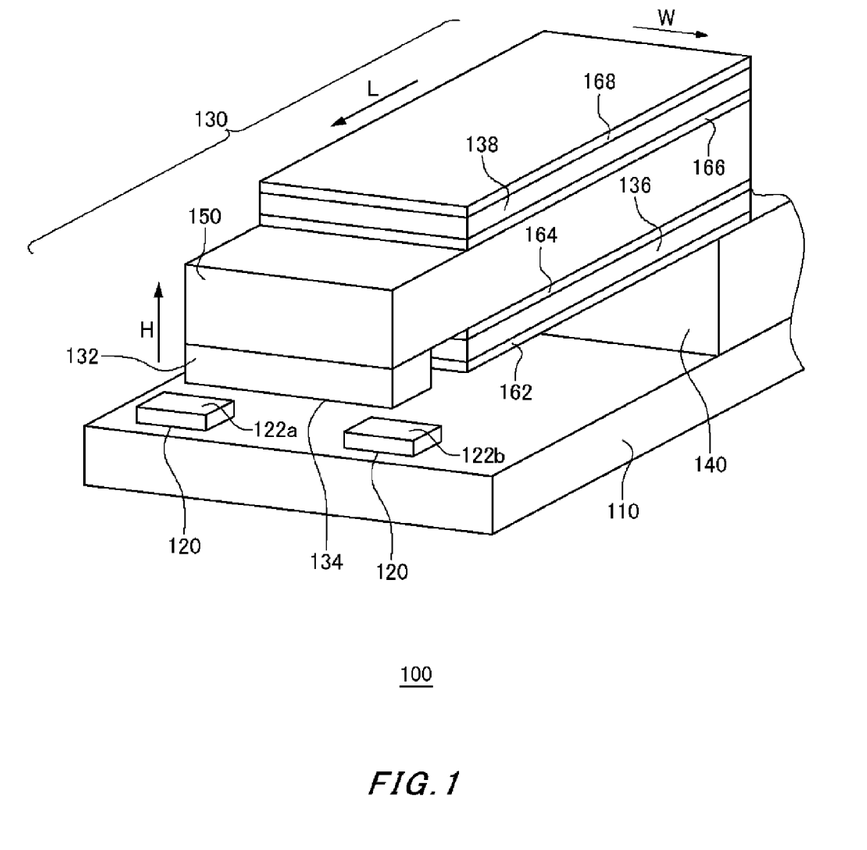
FIG. 1 shows an exemplary configuration of a switching apparatus 100 according to an embodiment of the present invention.
Figure 2:
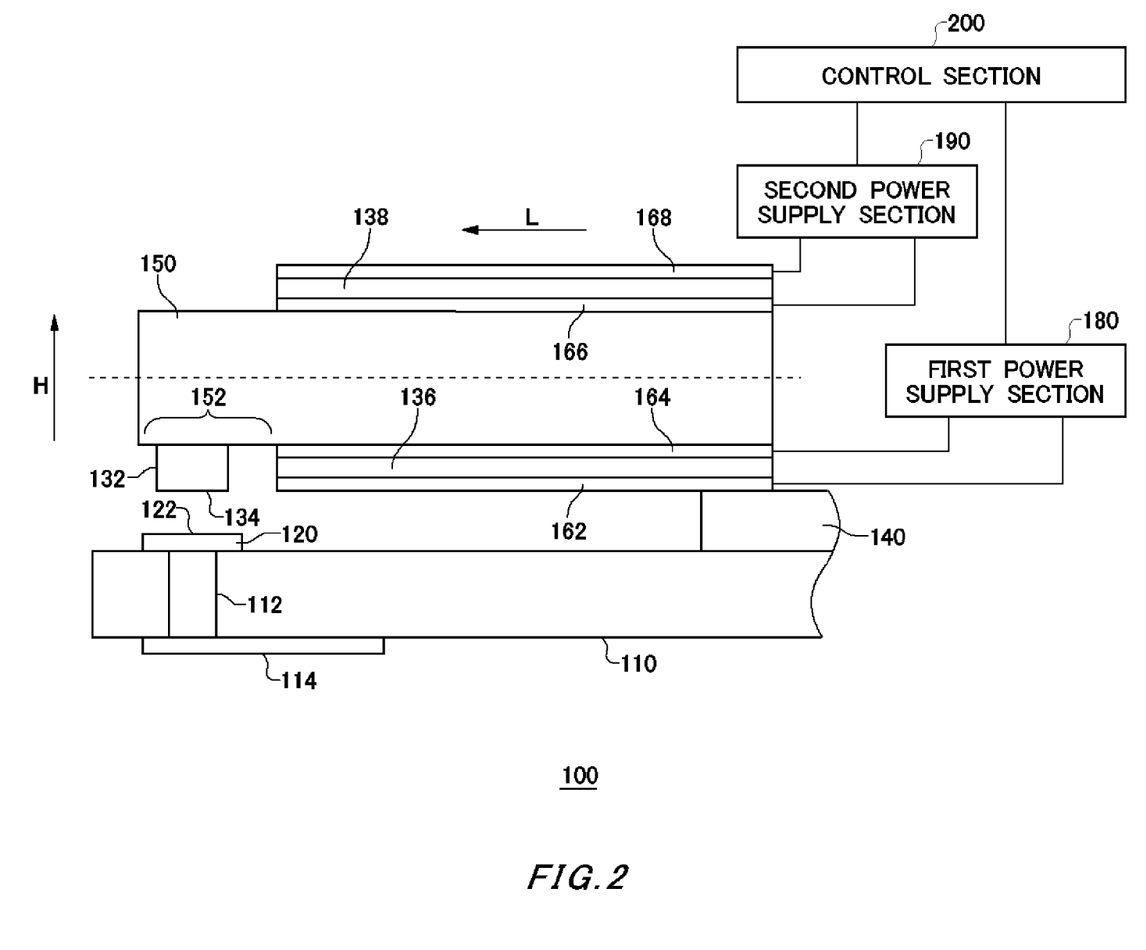
FIG. 2 shows a side view of the switching apparatus 100 according to the present embodiment.

FIG. 1 shows an exemplary configuration of a switching apparatus 100 according to an embodiment of the present invention. FIG. 2 shows a side view of the switching apparatus 100 according to the present embodiment. The switching apparatus 100 applies a drive voltage in a range exceeding a coercive electric field of a piezoelectric film when applying an electric field that causes the piezoelectric film to contract, and applies a drive voltage in a range that does not exceed the coercive electric field of the piezoelectric film when applying an electric field that causes the piezoelectric film to expand, thereby increasing displacement of an actuator 130.

The switching apparatus 100 causes a first contact point 122 and a second contact point 134 to contact or move away from each other, and may be sealed within a package, for example. The switching apparatus 100 includes a substrate 110, a first contact point section 120, the actuator 130, a base portion 140, a first power supply section 180, a second power supply section 190, and a control section 200.

The substrate 110 includes a flat first surface on which the first contact point section 120 is disposed. The substrate 110 may be an insulator. The substrate 110 may be an insulating glass substrate, or may be a semiconductor substrate made of silicon, for example. The substrate 110 includes a via 112 and a wiring section 114. The substrate 110 may include the wiring section 114 on a second surface thereof, which is different from the first surface on which the first contact point section 120 is provided.

The via 112 is formed of metal and electrically connects the first contact point section 120 to the wiring section 114. The via 112 may be formed to maintain a sealed state between the top and bottom surfaces of the substrate 110, in which through-holes are formed, by being filled with a conductive material. The substrate 110 may include a plurality of vias 112 corresponding to the number of first contact point sections 120 disposed on the substrate 110.

The wiring section 114 transmits a signal passed through the switching apparatus 100. The wiring section 114 may be a wiring pattern provided on the second surface of the substrate 110 to receive or transmit a signal to or from at least one via 112. The wiring section 114 may include a land, a connector, or an antenna, and may transmit and receive signals passed through the switching apparatus 100 from the outside.

The first contact point section 120 includes a first contact point 122. The first contact point 122 may be a flat surface without any protrusions. The first contact point section 120 may include aluminum, tungsten, palladium, rhodium, gold, platinum, ruthenium, indium, iridium, osmium, molybdenum, and/or nickel. The first contact point 122 may be an alloy of two or more of the above materials.

In the present embodiment, the switching apparatus 100 includes two first contact point sections 120 on the substrate 110, and two first contact points 122 of the first contact point sections 120 are brought into contact with and moved away from one second contact point 134. In this way, the switching apparatus 100 can turn ON/OFF the signal transmission from one of the first contact points 122a to the other first contact point 122b, via the second contact point 134. In this case, the wiring section 114 transmits a signal from the outside to the first contact point 122a, and this signal is transmitted from the first contact point 122b to the outside when the switching apparatus 100 is ON.

Instead, the switching apparatus 100 may include one first contact point section 120 on the substrate 110, a wiring section that transmits a signal from the outside to the second contact point 134 via the actuator 130 may be provided on the actuator 130, and the one first contact point 122 may be brought into contact with and moved away from the second contact point 134. In this way, the switching apparatus 100 can switch the signal transmission from the second contact point 134 to the first contact point 122 ON/OFF. The wiring section 114 transmits a signal received from the outside to the outside from the first contact point 122 when the switching apparatus 100 is ON.

The actuator 130 includes the second contact point 134 and moves the second contact point 134 to contact or move away from the first contact point 122. The actuator 130 may be deposited using a semiconductor process. The actuator 130 includes a second contact point section 132, a first piezoelectric film 136, a second piezoelectric film 138, a support layer 150, an exposed area 152, electrode layers 162 and 164 of the first piezoelectric film 136, and electrode layers 166 and 168 of the second piezoelectric film 138.

The second contact point 134 is provided on the second contact point section 132. The second contact point section 132 may include the same metal as the first contact point section 120. The second contact point 134 may be a flat surface without any protrusions, so as to contact the surface of the first contact point 122. Instead, the second contact point 134 may be semispherical in order to prevent degradation or damage of the first contact point 122, or may have a tip shaped as a rounded needle. For example, the second contact point 134 may have a predetermined shape that, when the second contact point 134 contacts the first contact point 122 to form a transmission path, creates a signal path having a width corresponding to the frequency of the signal being transmitted.

The first piezoelectric film 136 expands and contracts according to the first drive voltage. The first piezoelectric film 136 is arranged to expand and contract in the longitudinal direction of the actuator 130 when the first drive voltage is applied thereto, such that the actuator 130 curves to change the distance between the first contact point 122 and the second contact point 134.

Perovskite ferroelectric substances such as barium titanate (BTO), lead lanthanum zirconate titanate (PLZT), Lead zirconate titanate (PZT), aluminum nitride (AlN), or a zinc oxide (ZnO) wurtzite crystal may be used as the first piezoelectric film 136. For example, the first piezoelectric film 136 may be made of PZT and have a width in the W direction of 90 μm, a length in the L direction of 750 μm, and a height in the H direction of 0.5 μm.

The second piezoelectric film 138 is provided in parallel with the layering direction of the first piezoelectric film 136, and expands and contracts according to the second drive voltage. The second piezoelectric film 138 may be formed using perovskite ferroelectric substances, in the same manner as the first piezoelectric film 136. The second piezoelectric film 138 preferably uses substantially the same material and has substantially the same shape as the first piezoelectric film 136. For example, the second piezoelectric film 138 may be made of PZT and have a width in the W direction of 90 μm, a length in the L direction of 750 μm, and a height in the H direction of 0.5 μm.

The actuator 130 moves the second contact point 134 to contact or move away from the first contact point 122, according to the expansion and contraction of the first piezoelectric film 136 and the second piezoelectric film 138. The first piezoelectric film 136 and the second piezoelectric film 138 may be arranged on respective sides, in the height direction, of the center plane of the actuator 130. The first piezoelectric film 136 and the second piezoelectric film 138 are at substantially the same distance in the height direction from the central plane of the actuator 130. The actuator 130 may include a plurality of films that are layered substantially symmetrically with respect to the central plane of the actuator 130 in the height direction. In FIG. 2, the dashed line indicates the central plane in the height direction of the actuator 130.

The support layer 150 is provided between the first piezoelectric film 136 and the second piezoelectric film 138. In other words, the support layer 150 is provided on the first piezoelectric film 136, and the second piezoelectric film 138 is provided on the support layer 150. The support layer 150 is elastic and deforms when force is applied thereto, so that the actuator 130 bends when the first piezoelectric film 136 expands or contracts to exert a force on the support layer 150. The support layer 150 is rigid enough to prevent the actuator 130 from being bent too much, and to return the actuator 130 to the initial position when the first piezoelectric film 136 is not applying a force.

A conductor such as aluminum, gold, or platinum, an insulator such as glass, or a semiconductor such as silicon may be used for the support layer 150.

When forming the first piezoelectric film 136 or the second piezoelectric film 138, the support layer 150 is heated to a firing temperature along with the first piezoelectric film 136 or the second piezoelectric film 138. Therefore, the support layer 150 is made from a material that is not damaged when heated to the firing temperature of the first piezoelectric film 136 or the second piezoelectric film 138. If the first piezoelectric film 136 and the second piezoelectric film 138 are made of PZT, for example, the firing temperature can exceed 700° C. Therefore, the support layer 150 is preferably made of a material that does not exhibit physical damage such as cracks or fissures when heated to the firing temperature of the first piezoelectric film 136 and/or the second piezoelectric film 138.

Furthermore, the first support layer 150 is preferably made of a material that is unlikely to cause a chemical reaction with the piezoelectric films or the electrode layers when heated to the firing temperature of the first piezoelectric film 136 and the second piezoelectric film 138. The first support layer 150 is preferably made of a material that forms a compound with the piezoelectric films or the electrode layers as a result of being heated to the firing temperature of the piezoelectric films, and that does not exhibit physical damage such as cracks or fissures. In this case, the first support layer 150 is preferably made of a material that does not degrade the film characteristics, such as the piezoelectric constant, of the first piezoelectric film 136 or the second piezoelectric film 138 when heated to the firing temperature of the piezoelectric films.

The support layer 150 may be an insulating layer. By forming the support layer 150 as an insulating layer, the support layer 150 can tolerate the firing temperature of the piezoelectric films at approximately 700° C. and can be formed using a method such as CVD that is less expensive than a metal film.

The support layer 150 may include silicon oxide ($SiO_2$) or silicon nitride (SiN). The support layer 150 may $SiO_2$. Instead, the support layer 150 may be SiN. The support layer 150 may be made of silicon oxide ($SiO_2$) and have a width in the W direction of 90 μm, a length in the L direction of 750 μm, and a height in the H direction of 4 μm.

The exposed area 152 is a portion of the support layer 150 at one end thereof, which is the moving end of the actuator 130, where the first piezoelectric film 136 and the second piezoelectric film 138 are not formed. The second contact point 134 may be formed on the exposed area 152. Instead, the second contact point 134 may be formed on the electrode layer 162 on the moving end side. In this case, the support layer 150 may be covered by the first piezoelectric film 136, the second piezoelectric film 138, the electrode layer 162, the electrode layer 164, the electrode layer 166, and the electrode layer 168 up to the tip thereof.

The electrode layers 162 and 164 are formed on the top and bottom surfaces of the first piezoelectric film 136, and each apply a first drive voltage to the first piezoelectric film 136. The electrode layers 162 and 164 may each be flat and extend in the length direction L of the actuator 130. The electrode layers 162 and 164 may be made from metals that can be easily processed with low resistance, such as aluminum, gold, platinum, copper, indium, tungsten, molybdenum, ruthenium, and iridium, oxide compound electrodes such as ruthenium oxide ($RuO_2$) and iridium oxide ($IrO_2$), ceramic electrodes, or semiconductors such as silicon.

If silicon is used as the electrode material, the silicon is preferably doped to have high impurity density. For example, the electrode layers 162 and 164 may each be made of platinum and have a height of 0.2 μm in the height direction H. If the platinum is deposited using a vacuum deposition technique such as sputtering, the platinum may be deposited after depositing titanium or tantalum, for example.

The electrode layers 166 and 168 are formed on the top and bottom surfaces of the second piezoelectric film 138, and each apply a second drive voltage to the second piezoelectric film 138. The electrode layers 166 and 168 may each be flat and extend in the length direction L of the actuator 130. The electrode layers 166 and 168 may be made from substantially the same material and have substantially the same shape as the electrode layers 162 and 164. As another example, the electrode layer 166 may be made from substantially the same material and have substantially the same shape as the electrode layer 164, and the electrode layer 168 may be made from substantially the same material and have substantially the same shape as the electrode layer 162.

The base portion 140 is arranged on the substrate 110 at a position near the first contact point section 120 but distanced therefrom. The base portion 140 may be formed of $SiO_2$, for example. Instead, the base portion 140 may be a portion of the substrate 110 formed of silicon or glass, for example. The height of the base portion 140 is equal to or less than the maximum displacement of the actuator 130. The maximum displacement of the actuator 130 refers to the displacement of the actuator 130 when the maximum drive voltage is applied to the first piezoelectric film 136.

The actuator 130 may be fixed on the substrate 110 via the base portion 140, for example. The actuator 130 is supported at one end of the base portion 140 in the length direction L.

When a voltage is applied to the first piezoelectric film 136, the end of the actuator 130 on the second contact point side that is not supported by the base portion 140 bends in the height direction, which results in downward displacement or upward displacement in FIG. 2.

The actuator 130 is supported on the base portion 140, and the base portion 140 may be fixed above the actuator 130. For example, the actuator 130 may be housed and sealed in a package, and the base portion 140 may be fixed to a lid of the package above the actuator 130.

The first power supply section 180 applies the first drive voltage to the first piezoelectric film 136. The first power supply section 180 may supply the first drive voltage to the first piezoelectric film 136 according to a control signal received from the control section 200. The second power supply section 190 applies the second drive voltage to the second piezoelectric film 138. The second power supply section 190 may supply the second drive voltage to the second piezoelectric film 138 according to a control signal received from the control section 200.

The control section 200 controls the first power supply section 180 outputting the first drive voltage and the second power supply section 190 outputting the second drive voltage. The control section 200 may control the first power supply section 180 and the second power supply section 190 by transmitting a control signal to the first power supply section 180 and the second power supply section 190.

When bringing the first contact point 122 into contact with the second contact point 134 to turn ON the switching apparatus 100, the control section 200 applies the first drive voltage to the first piezoelectric film 136. When moving the first contact point 122 away from the second contact point 134 to turn OFF the switching apparatus 100, the control section 200 stops the supply of the first drive voltage to the first piezoelectric film 136.

As another example, when moving the first contact point 122 away from the second contact point 134 to turn OFF the switching apparatus 100, the control section 200 may apply the second drive voltage to the second piezoelectric film 138. When bringing the first contact point 122 into contact with the second contact point 134 to turn ON the switching apparatus 100, the control section 200 may stop the supply of the second drive voltage to the second piezoelectric film 138.

The control section 200 may supply the first piezoelectric film 136 and the second piezoelectric film 138 respectively with the first drive voltage and the second drive voltage set to predetermined values. The control section 200 may be hardware such as an electronic circuit, or may instead be software that operates according to a program, for example.

The actuator 130 of the present embodiment may be formed by layering, in the height direction H, an electrode layer 162 (platinum, 0.25 μm), a first piezoelectric film 136 (PZT, 0.5 μm), an electrode layer 164 (platinum, 0.25 μm), a support layer 150 ($SiO_2$, 4 μm), an electrode layer 166 (platinum, 0.25 μm), a second piezoelectric film 138 (PZT, 0.5 μm), and an electrode layer 168 (platinum, 0.25 μm). The actuator 130 may have a total height of 6 μm, and the portions other than the second contact point section 132 may be formed symmetrically with respect to the height.

Figure 3:
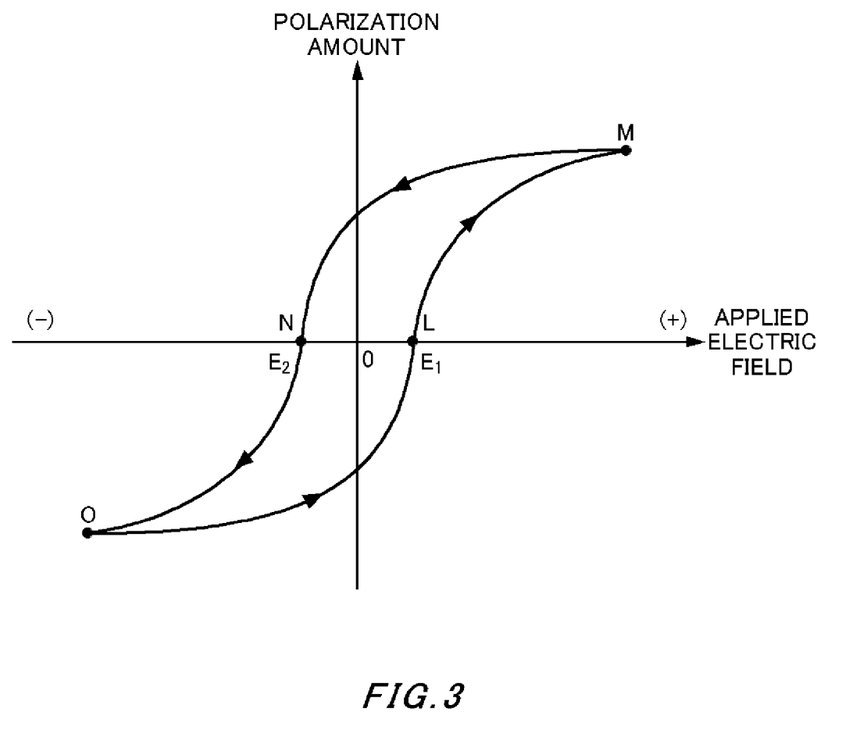
FIG. 3 shows an exemplary characteristic of polarization amount and applied electric field of a piezoelectric film according to the present embodiment.

FIG. 3 shows an exemplary characteristic of polarization amount and applied electric field of a piezoelectric film according to the present embodiment. In FIG. 3, the horizontal axis indicates the electric field applied to the piezoelectric film. Here, the applied electric field is applied to the piezoelectric film by two electrodes sandwiching the piezoelectric film, and therefore the strength of the electric field can increase in two directions, which are a plus (+) direction that is a direction parallel to the height direction of the piezoelectric film and oriented toward one of the poles and a minus (−) direction that is a direction parallel to the height direction of the piezoelectric film and oriented toward the other pole. The field strength of the applied electric field increases and decreases according to the absolute value of the voltage applied to the two electrodes.

In FIG. 3, a direction to the right on the horizontal axis from an applied electric field of zero indicates that an electric field in the + direction is applied to the piezoelectric film and the strength of the applied electric field is increasing while moving further to the right. Furthermore, a direction to the left on the horizontal axis from an applied electric field of zero indicates that an electric field in the − direction is applied to the piezoelectric film and the strength of the applied electric field is increasing while moving further to the left. The vertical axis indicates the polarization amount of the piezoelectric film corresponding to the applied electric field. As shown in FIG. 3, for a piezoelectric film made of a ferroelectric substance, the characteristic concerning the polarization amount and the applied electric field follows different curves according the hysteresis of the electric field, e.g. the curves O-L-M and O-N-M in FIG. 3.

If the piezoelectric film is in a state exhibiting the characteristic of the O-L-M curve, for example, the characteristic of the piezoelectric film changes to the O-N-M curve when the electric field increases from point L, at which the field strength is $E_1$ and the polarization amount is zero, to exceed point M. As a result, the polarization amount will not return to the original value of zero unless the field strength is set to $E_2$.

For example, when the field strength $E_1$ is applied to the piezoelectric film to increase the applied field strength in the + direction such that the polarization amount of the polarization characteristic changes from a value of zero at point L to exceed point M, the polarization amount will not return to point L even if the electric field is reduced to return the polarization amount to zero, and this reduction instead results in the polarization amount moving toward point N. Here, if the applied electric field strength is increased from point L to be within a range that does not exceed point M, the polarization amount can be returned to point L by decreasing the applied electric field to $E_1$ to set the polarization amount to zero.

Furthermore, when the field strength $E_2$ is applied to increase the applied field strength in the − direction such that the polarization amount of the polarization characteristic changes from a value of zero at point N to exceed point O, the polarization amount will not return to point N even if the electric field is reduced to return the polarization amount to zero, and this reduction instead results in the polarization amount moving toward point L. Here, if the applied electric field strength is increased from point N to be within a range that does not exceed point O, the polarization amount can be returned to point N by decreasing the applied electric field to $E_2$ to set the polarization amount to zero.

In this way, when an electric field that results in point M being exceeded is applied to the piezoelectric film and the applied electric field is then decreased, the state of the piezoelectric film changes along the M-N-O curve according to the applied electric field. Here, the sign of the polarization amount of the piezoelectric film inverts at point N, and therefore the electric field $E_2$ corresponding to the state at point N is referred to as a "coercive electric field." Furthermore, when the electric field applied to the piezoelectric film is decreased to exceed point O and then increased, the state of the piezoelectric film changes along the O-L-M curve according to the applied electric field. Here, the sign of the polarization amount of the piezoelectric film inverts at point L, and therefore the electric field $E_1$ corresponding to the state at point L is referred to as a "coercive electric field."

When the state of the piezoelectric film changes along the curve M-N-O, the polarity will not be inverted even if the applied electric field is changed to be near the coercive electric field $E_1$. Similarly, when the state of the piezoelectric film changes along the curve M-O-L-M, the polarity will not be inverted even if the applied electric field is changed to be near the coercive electric field $E_2$.

Figure 4:
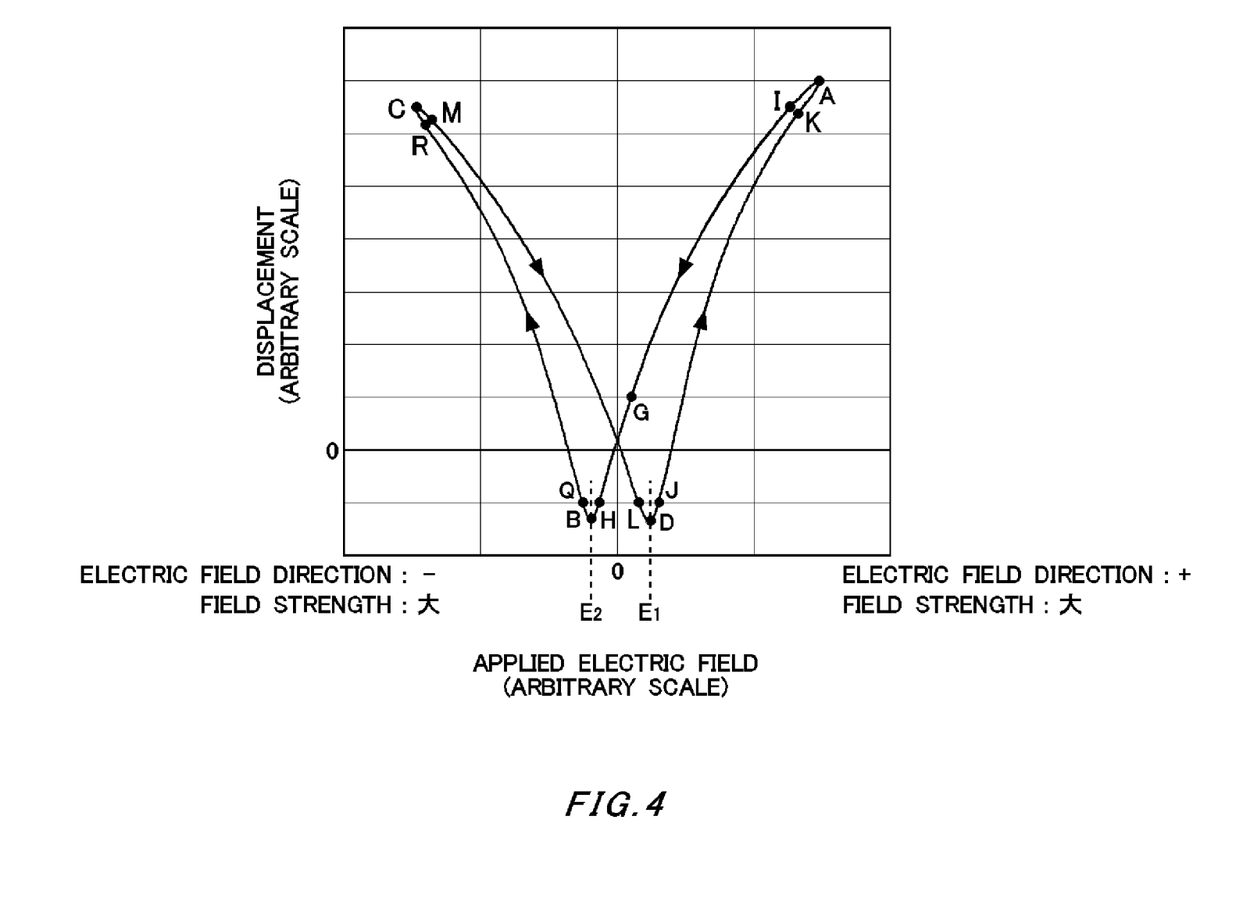
FIG. 4 shows an exemplary characteristic of applied electric field and displacement in the piezoelectric film according to the present embodiment.

FIG. 4 shows an exemplary characteristic of applied electric field and displacement in the piezoelectric film according to the present embodiment. In FIG. 4, the horizontal axis indicates the electric field applied to the piezoelectric film. The + direction and − direction on the horizontal axis are the same as in FIG. 3, and therefore further description is omitted. The vertical axis indicates displacement of the piezoelectric film corresponding to the applied electric field. This characteristic is an example of displacement of the piezoelectric film corresponding to the characteristic of the applied electric field and the polarization amount following the hysteresis curve shown in FIG. 3, and this displacement characteristic also follows a hysteresis curve.

For example, when the piezoelectric film is following the curve O-L-M in FIG. 3 and changes in the order O→L→M, the polarization amount of the piezoelectric film changes from a minimal value to a maximal value. Here, the expansion/contraction of the piezoelectric film increases according to the absolute value of the polarization amount, and therefore the displacement changes from a maximal value to a minimal value and then returns to a maximal value along the path C→D→A in FIG. 4, according to the change O→L→M in FIG. 3.

Here, the displacement becomes a minimal value as a result of applying the coercive electric field $E_1$ to the piezoelectric film. The displacement amounts corresponding to the minimal value and the maximal value depend on the materials and films used for the piezoelectric film. For the piezoelectric film in the present embodiment made of PZT, the maximal value indicates displacement in a contraction direction and the minimal value indicates displacement in the expansion direction.

When an electric field is applied to the piezoelectric film that results in point A being exceeded and the applied electric field is then decreased, the displacement of the piezoelectric film moves from a maximal value to a minimal value and then returns to a maximal value along the path A→B→C in FIG. 4, according to the change M→N→O in FIG. 3. Here, the displacement becomes a minimal value as a result of applying the coercive electric field $E_2$ to the piezoelectric film.

When controlling expansion and contraction of the piezoelectric film, it is preferable to use a region in which the applied electric field and the displacement have an approximately linear relationship. Accordingly, in conventional techniques, the drive voltage for a piezoelectric film having such a characteristic is set in a range that is narrower than the range from the coercive electric field $E_1$ to the coercive electric field $E_2$, such as the range from point G to point H.

The absolute value for the expansion and contraction displacement is controlled to be substantially the same at point H when expanding the piezoelectric film and at point G when contracting the piezoelectric film. With this control, the actuator including piezoelectric films on the top and bottom surfaces thereof can achieve bimorph operation in which one of the piezoelectric films is set to the H-point state to expand and the other piezoelectric film is set to the G-point state to contract.

By depositing the piezoelectric films to have uniform film quality using a sol-gel process, for example, the region in which the applied electric field and displacement of the piezoelectric film have a linear relationship can be expanded, as shown in FIG. 4. Accordingly, such a piezoelectric film can be displaced in the contracting direction up to the state at point A. In the present embodiment, the expansion and contraction of the piezoelectric film is controlled such that the contraction of the piezoelectric film occurs up to point I and expansion occurs up to point H. As a result, a region in which the expansion/contraction characteristic of the piezoelectric film is approximately linear can be used, and the displacement amount of the actuator can be increased.

In other words, the control section 200 causes the first piezoelectric film 136 to contract by causing a change from a voltage applying an electric field to the first piezoelectric film 136 that is less than a first coercive electric field to a voltage applying an electric field to the first piezoelectric film 136 that exceeds the first coercive electric field, and causes the first piezoelectric film 136 to expand by outputting a voltage applying an electric field to the first piezoelectric film 136 that is less than a second coercive electric field. In the present embodiment, the first coercive electric field is indicated by the coercive electric field $E_1$ in FIG. 4, and the second coercive electric field is indicated by the coercive electric field $E_2$. In other words, the control section 200 controls the expansion and contraction of the first piezoelectric film 136 using states between point H and point I in FIG. 4.

Instead, the control section 200 may cause the first piezoelectric film 136 to contract by causing a change from a voltage applying an electric field to the first piezoelectric film 136 that is less than the second coercive electric field $E_2$ to a voltage applying an electric field to the first piezoelectric film 136 that exceeds the second coercive electric field $E_2$, and cause the first piezoelectric film 136 to expand by outputting a voltage applying an electric field to the first piezoelectric film 136 that is less than the first coercive electric field $E_1$. In other words, the control section 200 controls the expansion and contraction of the first piezoelectric film 136 using states between point L and point M in FIG. 4.

Instead, the control section 200 may cause the first piezoelectric film to expand and contract by using a voltage that applies an electric field exceeding the first coercive electric field $E_1$ to the first piezoelectric film 136. In other words, control section 200 controls the expansion and contraction of the first piezoelectric film 136 using states between point J and point K in FIG. 4. Instead, the control section 200 may cause the first piezoelectric film to expand and contract by using a voltage that applies an electric field exceeding the second coercive electric field $E_2$ to the first piezoelectric film 136. In other words, the control section 200 controls the expansion and contraction of the first piezoelectric film 136 using states between point Q and point R in FIG. 4.

Similarly, by controlling the second drive voltage, the control section 200 causes the second piezoelectric film 138 to contract by causing a change from a voltage applying an electric field to the second piezoelectric film 138 that is less than the first coercive electric field $E_1$ to a voltage applying an electric field to the second piezoelectric film 138 that exceeds the first coercive electric field $E_1$, and causes the second piezoelectric film 138 to expand by outputting a voltage applying an electric field to the second piezoelectric film 138 that is less than the second coercive electric field $E_2$. In other words, the control section 200 controls the expansion and contraction of the second piezoelectric film 138 using states between point H and point I in FIG. 4.

Instead, the control section 200 may control the expansion and contraction of the second piezoelectric film 138 using states between point L and point M, states between point J and point K, or states between point Q and point R in FIG. 4. In this way, the control section 200 can displace the piezoelectric film by a large amount by controlling the drive voltages when expanding the piezoelectric film or contracting the piezoelectric film according to the characteristic of the piezoelectric film concerning the applied electric field and displacement.

The present embodiment describes an example in which the actuator 130 including the piezoelectric films described above is used as a switching apparatus 100. In this case, the actuator 130 includes the support layer 150 having rigidity that returns the actuator 130 to an initial position when the first piezoelectric film 136 does not apply force thereto, and therefore the actuator 130 only needs to move the second contact point 134 in one direction relative to the first contact point 122. Accordingly, by contracting the first piezoelectric film 136 to move the actuator 130 toward the first contact point 122, the control section 200 can increase the maximum displacement amount to be greater than when the actuator 130 moves in a direction resulting from expansion of the piezoelectric film.

As a result, the switching apparatus 100 can move the second contact point 134 and the first contact point 122 far enough away from each other when in the OFF state, and can prevent the contact point from contacting each other as a result of wear over time, temperature dependencies, or residual stress from the manufacturing of the actuator 130. In this case, the switching apparatus 100 can switch between ON and OFF by moving in one direction without inverting the polarity of the piezoelectric films, and therefore the lifetime of the piezoelectric films is greater than when this operation involves inverting the polarity of the piezoelectric films.

Furthermore, when bringing the first contact point 122 and the second contact point 134 into contact with each other, the control section 200 applies to the first piezoelectric film 136 a first drive voltage causing the first piezoelectric film 136 to contract, such that the actuator 130 bends toward the first piezoelectric film 136. When switching the first contact point 122 and the second contact point 134 from the contact state to a separated state, the control section 200 stops the supply of the first drive voltage and applies to the second piezoelectric film 138 a second drive voltage causing the second piezoelectric film 138 to contract, such that the actuator 130 is biased in a return direction.

In this way, by moving the first piezoelectric film 136 and the second piezoelectric film 138 in one direction each, the control section 200 can use the pressing force of the piezoelectric films for both the ON and OFF operations. This switching apparatus 100 can add an external force in a direction moving the first contact point 122 and the second contact point 134 away from each other when being turned OFF, and can therefore prevent the contact points from sticking together.

When switching the first contact point 122 and the second contact point 134 from the contact state to a separated state, the control section 200 applies an electric field that is less than the second coercive electric field to the first piezoelectric film 136, such that the first piezoelectric film 136 expands and the actuator is biased in the return direction. As a result, the switching apparatus 100 can bias the actuator in the return direction using the piezoelectric film, without inverting the polarity of the piezoelectric films.

The control section 200 may switch whether the second piezoelectric film 138 is used to bias the actuator 130 in the return direction, according to the initial position, cumulative usage time, or cumulative number of uses of the actuator 130. If the actuator 130 is rigid, the actuator 130 will return to the initial position when the force is no longer applied by the first piezoelectric film 136. Accordingly, when the switching apparatus 100 is OFF, the control section 200 need not use the second piezoelectric film 138 to bias the actuator 130 in the return direction if the actuator 130 is rigid.

The control section 200 records the cumulative usage time or cumulative number of uses of the actuator 130. The control section 200 may switch whether the second piezoelectric film 138 is used to bias the actuator 130 in the return direction based on a predetermined cumulative usage time or cumulative number of uses.

More specifically, the control section 200 biases the actuator 130 in the return direction when the cumulative number of uses or cumulative usage time of the actuator 130 is greater than a predetermined reference time. In this way, the switching apparatus 100 biases the actuator 130 in the return direction using the second piezoelectric film 138 when the rigidity of the actuator 130 has decreased due to the cumulative usage time or cumulative number of uses, thereby preventing the contact points from sticking together and maintaining a substantially constant shut-off time for the switching.

The control section 200 may measure and store an initial position occurring when the first contact point 122 and the second contact point 134 are in the separated state. For example, the rigidity of the actuator 130 decreases when wear is accumulated, and therefore the initial position of the actuator 130 moves toward the first contact point 122.

More specifically, when the initial position measured for the actuator 130 moves toward the first contact point 122 to be distanced from the stored initial position by an amount greater than or equal to a predetermined reference distance, the control section 200 biases the actuator 130 in the return direction. In this way, the switching apparatus 100 biases the actuator 130 in the return direction using the second piezoelectric film 138 according to the initial position of the actuator 130, thereby preventing the contact points from sticking together and maintaining a substantially constant shut-off time for the switching.

The switching apparatus 100 may include a monitor section that measures the initial position of the actuator 130. The monitor section may measure a displacement voltage when the applied voltage is not supplied to the first piezoelectric film 136 or the second piezoelectric film 138. For example, the monitor section may be connected to the electrode layer 166 and the electrode layer 168, and detect the potential difference between these electrode layers to be the displacement voltage generated by the second piezoelectric film 138.

The control section 200 may switch whether the actuator 130 is biased in the return direction by the second piezoelectric film 138 according to a desired switching speed. The desired switching speed may be a predetermined constant switching speed, or may be a switching speed that changes dynamically during operation of the switching apparatus 100.

If the switching speed required when switching the switching apparatus 100 from ON to OFF is low enough that the rigidity of the actuator 130 causes the actuator 130 to return to the initial position quickly enough, there is no need for the control section 200 to bias the actuator 130 in the return direction using the second piezoelectric film 138.

If the switching speed desired when switching the switching apparatus 100 from ON to OFF is high enough that the rigidity of the actuator 130 does not cause the actuator 130 to return to the initial position quickly enough, the control section 200 biases the actuator 130 in the return direction using the second piezoelectric film 138. In this way, the switching apparatus 100 does not apply the drive voltages to the piezoelectric films when the necessary switching speed is low, and therefore the lifetime of the piezoelectric films is increased.

In the above embodiments, when switching the first contact point 122 and the second contact point 134 from the contact state to the separated stated, the control section 200 stops the supply of the first drive voltage and applies to the second piezoelectric film 138 a second drive voltage causing the second piezoelectric film 138 to contract, thereby biasing the actuator 130 in the return direction. Instead of or in addition to this operation, when bringing the first contact point 122 and the second contact point 134 into contact with each other, the control section 200 may cause a change from a voltage applying an electric field to the first piezoelectric film 136 that exceeds the first coercive electric field $E_1$ to a voltage applying an electric field to the first piezoelectric film 136 that is less than the first coercive electric field $E_1$, apply this voltage as a first drive voltage causing the first piezoelectric film 136 to contract, and apply a second drive voltage that causes the second piezoelectric film to expand by providing an electric field that is less than the second coercive electric field $E_2$ of the second piezoelectric film 138, thereby exerting the bias force.

In this way, the control section 200 can bring the first contact point 122 and the second contact point 134 firmly into contact with each other, and remove contaminants or oxidized film, for example, formed between the contact points, thereby preventing an increase in the contact resistance between the contact points. Furthermore, by exerting the pressing bias, the control section 200 can increase the switching speed when switching to the ON state.

Furthermore, when bringing the first contact point 122 and the second contact point 134 into contact with each other, the control section 200 may cause a change from a voltage applying an electric field to the first piezoelectric film 136 that is less than the second coercive electric field $E_2$ to a voltage applying an electric field to the first piezoelectric film 136 that exceeds the second coercive electric field $E_2$, apply this voltage as a first drive voltage causing the first piezoelectric film 136 to contract, and apply a second drive voltage that causes the second piezoelectric film to expand by providing an electric field that is less than the first coercive electric field $E_1$ of the second piezoelectric film 138.

In this case, the control section 200 performs so-called bimorph operation, in which the first piezoelectric film 136 contracts and the second piezoelectric film 138 expands. According to the voltage characteristic of each piezoelectric film, the control section 200 controls the drive voltages such that a voltage causing optimal displacement in the expanding direction and contracting direction is applied to each piezoelectric film and the polarity of each piezoelectric film is not inverted, so that the piezoelectric film operates in only one direction. In this way, the control section 200 can cause the first piezoelectric film 136 and the second piezoelectric film 138 to operate efficiently, thereby extending the lifetime of the piezoelectric films.

Since the piezoelectric film has a complicated characteristic that follows a hysteresis curve in the manner described above, the control section 200 may measure the applied voltage and displacement characteristic for each of the first piezoelectric film 136 and the second piezoelectric film 138 in advance, and store the measurement results. Furthermore, the hysteresis curve of a piezoelectric film can depend on the frequency of the applied voltage, and therefore the control section 200 may measure the frequency characteristic of the displacement and applied electric field of the first piezoelectric film 136 and the second piezoelectric film 138 in advance, and store the measurement results. The control section 200 may set the first drive voltage and the second drive voltage based on these measurement results.

Even if the same electric field is applied to each piezoelectric film, the state of each piezoelectric film does not necessarily change from point H to point I, for example. Therefore, the control section 200 may apply predetermined electric fields to the first piezoelectric film 136 and the second piezoelectric film 138 during an initial stage in the operation of the switching apparatus 100. For example, when controlling the expansion and contraction of the first piezoelectric film 136 using states between point H and point I, the control section 200 may apply an electric field the results in point A being exceeded to the first piezoelectric film 136 during this initial stage.

Figure 5:
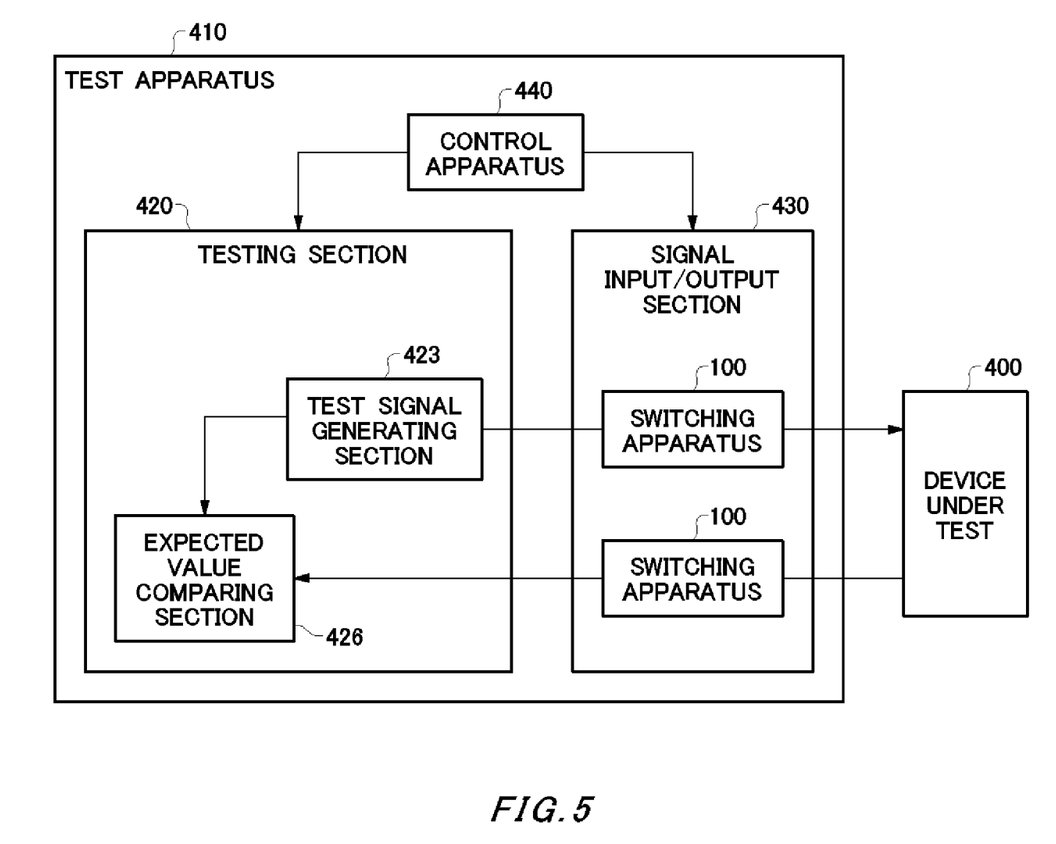
FIG. 5 shows an exemplary configuration of a test apparatus 410 according to the present embodiment, along with a device under test 400.

FIG. 5 shows an exemplary configuration of a test apparatus 410 according to the present embodiment, along with a device under test 400. The test apparatus 410 tests at least one device under test 400, which may be an analog circuit, a digital circuit, an analog/digital mixed circuit, a memory, or a system on chip (SOC), for example. The test apparatus 410 supplies the device under test 400 with a test signal based on a test pattern for testing the device under test 400, and judges pass/fail of the device under test 400 based on an output signal output by the device under test 400 in response to the test signal.

The test apparatus 410 includes a testing section 420, a signal input/output section 430, and a control apparatus 440. The testing section 420 tests the device under test 400 by exchanging electric signals with the device under test 400. The testing section 420 includes a test signal generating section 423 and an expected value comparing section 426.

The test signal generating section 423 is connected to one or more devices under test 400 via the signal input/output section 430, and generates a plurality of test signals to be supplied to the device under test 400. The test signal generating section 423 may generate expected values for the response signals output by the device under test 400 in response to the test signals.

The expected value comparing section 426 compares a data value contained in the response signal from the device under test 400 received from the signal input/output section 430 to an expected value generated by the test signal generating section 423. The expected value comparing section 426 judges pass/fail of the device under test 400 based on the comparison result.

The signal input/output section 430 electrically connects the device under test 400 to be tested to the testing section 420, and transmits the test signal generated by the test signal generating section 423 to the device under test 400. The signal input/output section 430 also receives the response signal output by the device under test 400 in response to the test signal. The signal input/output section 430 transmits the response signal received from the device under test 400 to the expected value comparing section 426. The signal input/output section 430 may be a performance board mounted on a plurality of devices under test 400. The signal input/output section 430 includes the switching apparatus 100.

The switching apparatus 100 is provided between the testing section 420 and the device under test 400, and provides an electrical connection or disconnection between the testing section 420 and the device under test 400. The test apparatus 410 performs electrical connecting or disconnecting using the switching apparatus 100 according to the present embodiment.

The present embodiment describes an example in which the signal input/output section 430 is connected to one device under test 400, and one switching apparatus 100 is provided to each of the input signal line and the output signal line of the one device under test 400. Instead, the signal input/output section 430 may be connected to a plurality of devices under test 400, and one switching apparatus 100 may be provided to each input signal line and output signal line of each device under test 400. If there is one input/output signal line connecting the signal input/output section 430 to the device under test 400, one switching apparatus 100 may be provided to the one input/output line.

The control apparatus 440 transmits a control signal to the testing section 420 and the signal input/output section 430, to begin execution of the testing by the test apparatus 410. The control apparatus 440 transmits a control signal that causes the testing section 420 to perform a comparison between the test result and the expected value or to generate a test signal, for example, according to a test program. Furthermore, according to the test program, the control apparatus 440 transmits to the signal input/output section 430 instructions for connecting the switching apparatuses 100 provided to signal input/output lines to be connected and instructions for disconnecting the switching apparatuses 100 provided to signal input/output lines to be disconnected.

The test apparatus 410 of the present embodiment described above can move the actuator 130 by a displacement amount corresponding to the voltage characteristics of the piezoelectric films, and can perform testing using a switching apparatus 100 that has an increased maximum displacement amount. Furthermore, the test apparatus 410 can perform testing using switching control with low power consumption, by controlling the voltage, and using a switching apparatus 100 with an extended lifetime. Yet further, the test apparatus 410 can perform testing using a switching apparatus 100 that decreases the probability of the contact points sticking together.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:
1. A switching apparatus comprising:
a contact point section that includes a first contact point;
an actuator that includes a second contact point that can move into contact with and move away from the first contact point, a first piezoelectric film that expands and contracts according to a first drive voltage, a support layer disposed on the first piezoelectric film, and a second piezoelectric film disposed on the support layer that expands and contracts according to a second drive voltage; and a control section that controls the first drive voltage and the second drive voltage, wherein the control section causes the first piezoelectric film to contract by causing a change from a voltage that applies an electric field to the first piezoelectric film that is less than a first coercive electric field to a voltage that applies an electric field to the first piezoelectric film that exceeds the first coercive electric field, and causes the first piezoelectric film to expand by outputting a voltage that applies an electric field to the first piezoelectric film that is less than a second coercive electric field, and the control section causes the second piezoelectric film to contract by causing a change from a voltage that applies an electric field to the second piezoelectric film that is less than the first coercive electric field to a voltage that applies an electric field to the second piezoelectric film that exceeds the first coercive electric field, and to expand the second piezoelectric film by causing a voltage that applies an electric field to the second piezoelectric film that is less than the second coercive electric field to be output, wherein when moving the second contact point into contact with the first contact point, the control section causes the actuator to bend toward the first piezoelectric film by applying to the first piezoelectric film the first drive voltage causing the first piezoelectric film to contract, and when switching the first contact point and the second contact point from a contact state to a separated state by moving the second contact point away from the first contact point, the control section biases the actuator to return by stopping the supply of the first drive voltage and applying to the second piezoelectric film the second drive voltage causing the second piezoelectric film to contract.

2. The switching apparatus according to claim 1, wherein the control section switches whether the actuator is biased to return by the second piezoelectric film according to an initial position, cumulative usage time, or cumulative number of uses of the actuator.

3. The switching apparatus according to claim 1, wherein when bringing the first contact point and the second contact point into contact with each other, the control section applies the first drive voltage causing the first piezoelectric film to contract, and applies the second drive voltage that causes the second piezoelectric film to expand.

4. The switching apparatus according to claim 1, wherein the first piezoelectric film and the second piezoelectric film are disposed at respective sides of a central plane of the actuator in a height direction of the actuator.

5. The switching apparatus according to claim 4, wherein the first piezoelectric film and the second piezoelectric film have substantially the same thickness and are disposed substantially the same distance in the height direction from the central plane of the actuator.

6. The switching apparatus according to claim 5, wherein the actuator includes a plurality of films that are layered substantially symmetrically with respect to the central plane of the actuator in the height direction.

7. The switching apparatus according to claim 1, wherein the first piezoelectric film and the second piezoelectric film are each a PZT film.

8. The switching apparatus according to claim 7, wherein when forming the first piezoelectric film or the second piezoelectric film, the support layer is heated to a firing temperature together with the first piezoelectric film or the second piezoelectric film.

9. The switching apparatus according to claim 1, wherein when moving the first contact point and the second contact point away from each other out of a contact state, the control section biases the actuator to return by applying an electric field that is less than the second coercive electric field to the first piezoelectric film to expand the first piezoelectric film.

10. The switching apparatus according to claim 1, wherein the support layer is an insulating film including $SiO_2$ or SiN.

11. A test apparatus that tests a device under test, comprising:
a testing section that tests the device under test by exchanging electrical signals with the device under test; and
the switching apparatus according to claim 1 that is provided between the testing section and the device under test and provides an electrical connection or disconnection between the testing section and the device under test.

12. A switching apparatus comprising:
a contact point section that includes a first contact point;
an actuator that includes a second contact point that can move into contact with and move away from the first contact point, a first piezoelectric film that expands and contracts according to the first drive voltage, a support layer disposed on the first piezoelectric film, and a second piezoelectric film disposed on the support layer that expands and contracts according to a second drive voltage; and
a control section that controls the first drive voltage and the second drive voltage, wherein
the control section causes the first piezoelectric film to contract by causing a change from a voltage that applies an electric field to the first piezoelectric film that is less than a first coercive electric field to a voltage that applies an electric field to the first piezoelectric film that exceeds the first coercive electric field, and causes the first piezoelectric film to expand by outputting a voltage that applies an electric field to the first piezoelectric film that is less than a second coercive electric field, and
the control section causes the second piezoelectric film to contract by causing a change from a voltage that applies an electric field to the second piezoelectric film that is less than the first coercive electric field to a voltage that applies an electric field to the second piezoelectric film that exceeds the first coercive electric field, and to expand the second piezoelectric film by causing a voltage that applies an electric field to the second piezoelectric film that is less than the second coercive electric field to be output
wherein when bringing the first contact point and the second contact point into contact with each other, the control section applies the first drive voltage causing the first piezoelectric film to contract, and applies the second drive voltage that causes the second piezoelectric film to expand.

13. The switching apparatus according to claim 12, wherein
the control section switches whether the actuator is biased to return by the second piezoelectric film according to an initial position, cumulative usage time, or cumulative number of uses of the actuator.

14. The switching apparatus according to claim 12, wherein
the first piezoelectric film and the second piezoelectric film are disposed at respective sides of a central plane of the actuator in a height direction of the actuator.

15. The switching apparatus according to claim 14, wherein
the first piezoelectric film and the second piezoelectric film have substantially the same thickness and are disposed substantially the same distance in the height direction from the central plane of the actuator.

16. The switching apparatus according to claim 15, wherein
the actuator includes a plurality of films that are layered substantially symmetrically with respect to the central plane of the actuator in the height direction.

17. The switching apparatus according to claim 12, wherein
the first piezoelectric film and the second piezoelectric film are each a PZT film.

18. The switching apparatus according to claim 17, wherein
when forming the first piezoelectric film or the second piezoelectric film, the support layer is heated to a firing temperature together with the first piezoelectric film or the second piezoelectric film.

19. The switching apparatus according to claim 12, wherein
when moving the first contact point and the second contact point away from each other out of a contact state, the control section biases the actuator to return by applying an electric field that is less than the second coercive electric field to the first piezoelectric film to expand the first piezoelectric film.

20. The switching apparatus according to claim 12, wherein
the support layer is an insulating film including $SiO_2$ or SiN.

* * * * *